United States Patent
Park

(10) Patent No.: US 7,928,532 B2
(45) Date of Patent: Apr. 19, 2011

(54) FUSE BOX INCLUDING A GUARD RING ELECTRICALLY CONNECTED TO THE FUSE PATTERN AND METHOD OF FORMING THE SAME

(75) Inventor: Seung Pyo Park, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 38 days.

(21) Appl. No.: 11/966,379

(22) Filed: Dec. 28, 2007

(65) Prior Publication Data

US 2009/0102013 A1    Apr. 23, 2009

(30) Foreign Application Priority Data

Oct. 17, 2007  (KR) .................. 10-2007-0104700

(51) Int. Cl.
*H01L 23/52* (2006.01)
(52) U.S. Cl. .................. 257/529; 257/209; 257/530
(58) Field of Classification Search .................. 257/529, 257/530; 438/601
See application file for complete search history.

(56) References Cited

U.S. PATENT DOCUMENTS

| | | | |
|---|---|---|---|
| 6,337,507 B1 * | 1/2002 | Bohr et al. | 257/529 |
| 6,455,894 B1 * | 9/2002 | Matsumoto et al. | 257/347 |
| 6,933,591 B1 * | 8/2005 | Sidhu et al. | 257/665 |
| 2002/0038902 A1 * | 4/2002 | Naiki | 257/529 |
| 2002/0088999 A1 * | 7/2002 | Krishnan | 257/209 |
| 2004/0012071 A1 * | 1/2004 | Ido et al. | 257/529 |
| 2004/0140501 A1 * | 7/2004 | Kim | 257/328 |
| 2007/0052063 A1 * | 3/2007 | Ueda | 257/529 |
| 2007/0252237 A1 * | 11/2007 | Ko et al. | 257/529 |
| 2007/0280012 A1 * | 12/2007 | Obayashi et al. | 365/200 |
| 2007/0284693 A1 * | 12/2007 | Kim et al. | 257/529 |

FOREIGN PATENT DOCUMENTS

| | | | |
|---|---|---|---|
| JP | 2007-081420 | | 3/2007 |
| KR | 20050106876 A | * | 11/2005 |
| KR | 1020050106876 A | | 11/2005 |
| KR | 1020070077382 A | | 7/2007 |

* cited by examiner

*Primary Examiner* — Marcos D Pizarro
*Assistant Examiner* — Raj Gupta
(74) *Attorney, Agent, or Firm* — Kilpatrick Townsend & Stockton LLP

(57) ABSTRACT

A fuse box includes a fuse pattern having a rugged profile and an interlayer insulating film including a fuse blowing window to fill the fuse pattern.

11 Claims, 9 Drawing Sheets

FUSE BOX INCLUDING A GUARD RING ELECTRICALLY CONNECTED TO THE FUSE PATTERN AND METHOD OF FORMING THE SAME

CROSS-REFERENCES TO RELATED APPLICATIONS

The priority of Korean patent application number 10-2007-0104700, filed on Oct. 17, 2007, which is incorporated by reference in its entirety, is claimed.

BACKGROUND OF THE INVENTION

The present invention relates to a fuse in a semiconductor device. More particularly, the present invention relates to a fuse box including a fuse pattern and a method of forming the same.

A semiconductor device such as a Dynamic Random Access Memory (DRAM) has memory cells that do not function normally. Such defective memory cells are replaced with redundancy cells that are previously made in the manufacture of semiconductor devices. This replacing process is called "a repair process" to improve yield of devices.

The repair process selects a defective memory cell, and performs a program in an internal circuit to replace the corresponding address with an address signal of a redundancy cell. When the address corresponding to a defective line is input, a line of the redundancy cell is switched instead of the defective line. One of the programs is a cut method to fire and cut off a fuse with a laser beam.

The line cut by a laser in the cut method is referred to as a "fuse". The fuse is formed while a plate electrode is formed in a cell region. However, in blowing a fuse using a laser, a fuse fail can occur where a fuse is not completely cut.

SUMMARY OF THE INVENTION

Embodiments of the present invention are directed to a fuse. According to an embodiment of the present invention, the fuse includes a fuse pattern having a rugged profile such as an embossed profile during a process of forming a plate electrode, thereby preventing a fuse blowing fail. In addition, the fuse includes a dummy contact plug and a dummy line used as a guard ring during a process of forming a first metal contact plug and a first metal line, thereby preventing oxidation of the plate electrode and crack of a fuse pattern. Accordingly, yield and reliability of devices can be improved.

According to an embodiment of the present invention, a fuse box includes: a fuse pattern and an interlayer insulating film. The fuse pattern has a rugged profile. The interlayer insulating film fills the fuse pattern with a fuse blowing window.

According to an embodiment of the present invention, a method for forming a fuse box includes: forming a plate electrode over a semiconductor substrate to form a fuse pattern having a rugged profile. An interlayer insulating film is formed over the semiconductor substrate including the plate electrode and the fuse pattern. A portion of the interlayer insulating film is selectively etched to form a fuse blowing window.

According to another embodiment of the present invention, a method for forming a fuse box includes: forming a plate electrode over a semiconductor substrate to form a fuse pattern having a rugged profile. A first interlayer insulating film is formed over the semiconductor substrate including the plate electrode and the fuse pattern. A first metal contact plug and a dummy contact plug for guard ring are formed in the first interlayer insulating film. The first metal contact plug is electrically connected with the plate electrode. A first metal interconnect line and a dummy interconnect line are formed over the first interlayer insulating film. The first metal interconnect line is electrically connected with the first metal contact plug. The dummy interconnect line is electrically connected with the dummy contact plug. A second interlayer insulating film is formed over the first interlayer insulating film including the first metal interconnect line and the dummy interconnect line. The second interlayer insulating film and a portion of the first interlayer insulating film are selectively etched to form a fuse blowing window.

DESCRIPTION OF EMBODIMENTS

The present invention relates to a fuse in a semiconductor device. According to an embodiment of the present invention, a fuse includes a fuse box having a fuse pattern with an uneven outline (or rugged profile).

Figure 1:
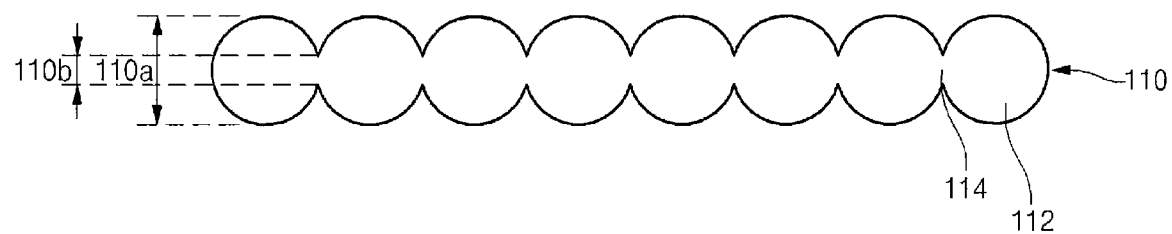
FIG. 1 is a top-view of a fuse pattern according to an embodiment of the present invention.

FIG. 1 is a top-view of a fuse pattern according to an embodiment of the present invention. A fuse pattern 110 is formed to have an uneven outline allowing a fuse to be blown more easily, thereby preventing an uncut phenomenon. Fuse pattern 110 has a first line-width 110a and a second line-width 110b. Second line-width 110b ranges from 5% to 20% of first line-width 110a. That is the fuse pattern includes a plurality of bodies 112 and a plurality of connectors 114 connecting bodies 114. Bodies 112 have first line-width 110a, and connectors 114 have second line-width 110b.

Figure 2:
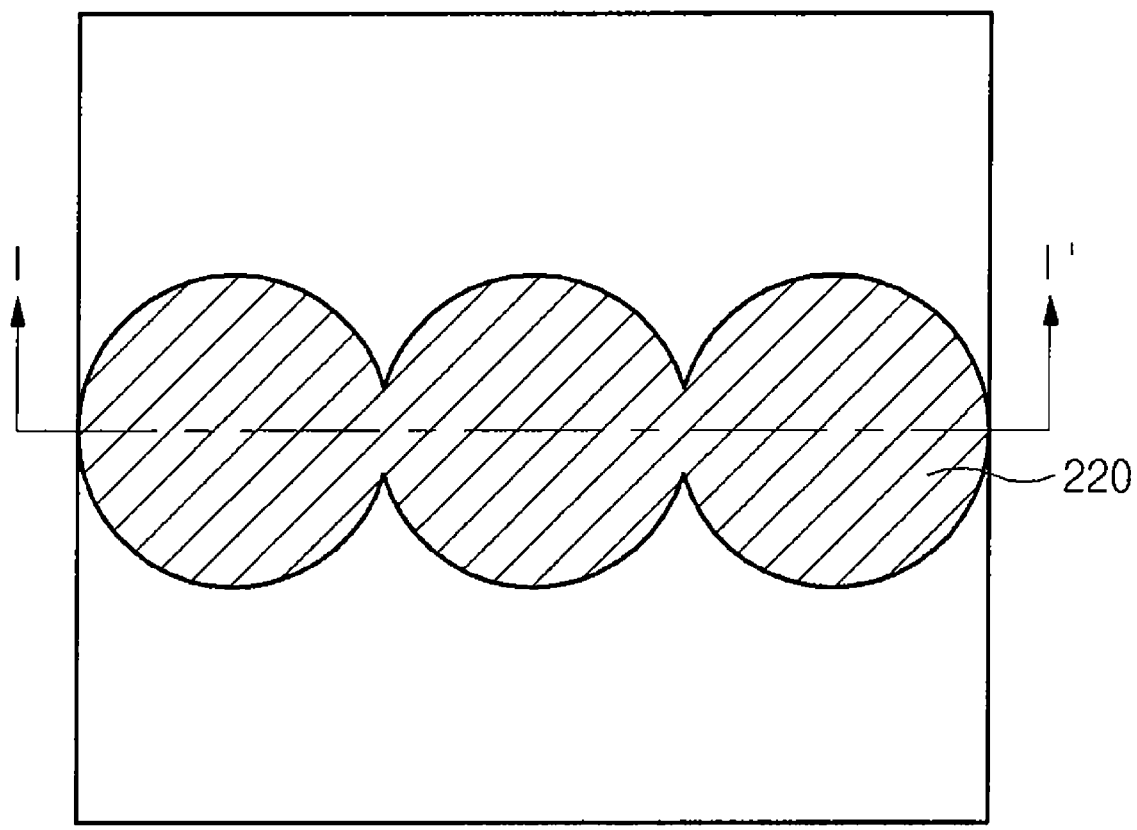
FIG. 2 is a layout of a fuse pattern according to an embodiment of the present invention.

FIG. 2 is a layout of a fuse pattern according to an embodiment of the present invention. A fuse pattern region 220 is defined by an uneven outline, the center of which is connected.

FIGS. 3a to 3d are cross-sectional views illustrating a method of forming a fuse pattern according to an embodiment of the present invention. A first insulating film 332 is formed over a semiconductor substrate 330. A second insulating pattern 334 exposing first insulating film 332 is formed over first insulating film 332. First insulating film 332 is isotropic-etched to form a recess 336 having an uneven outline, the center of which is connected. Second insulating pattern 334 is formed with a material having a large etching selectivity over first insulating film 332. As a result, second insulating pattern 334 is not removed when first insulating film 332 is etched.

Figure 3A:
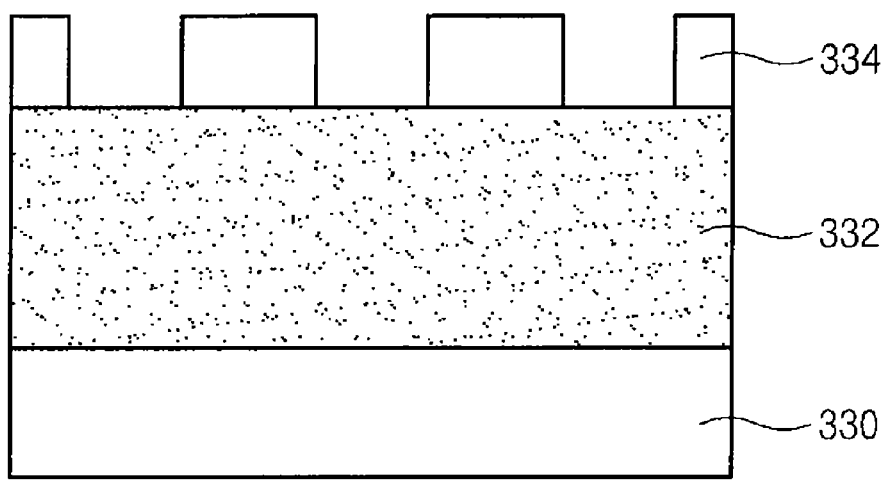
FIGS. 3a to 3d are cross-sectional views illustrating a method of forming a fuse pattern according to an embodiment of the present invention.
Figure 3B:
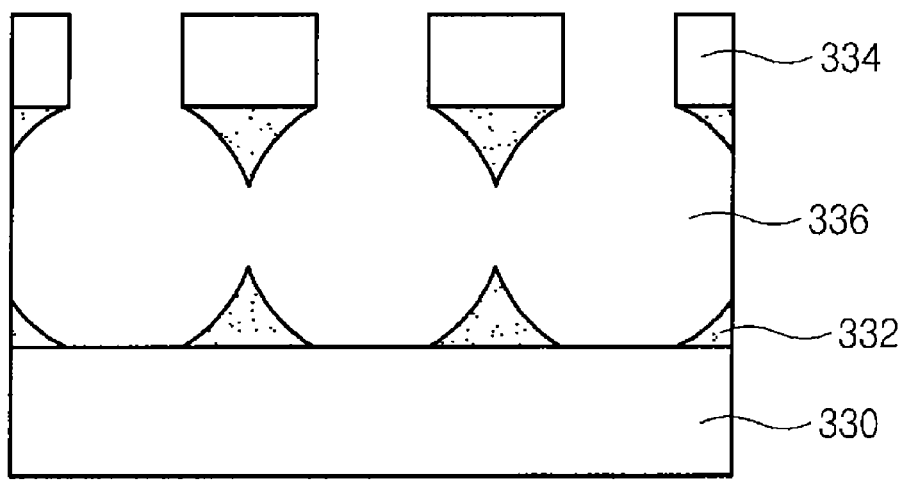
Figure 3C:
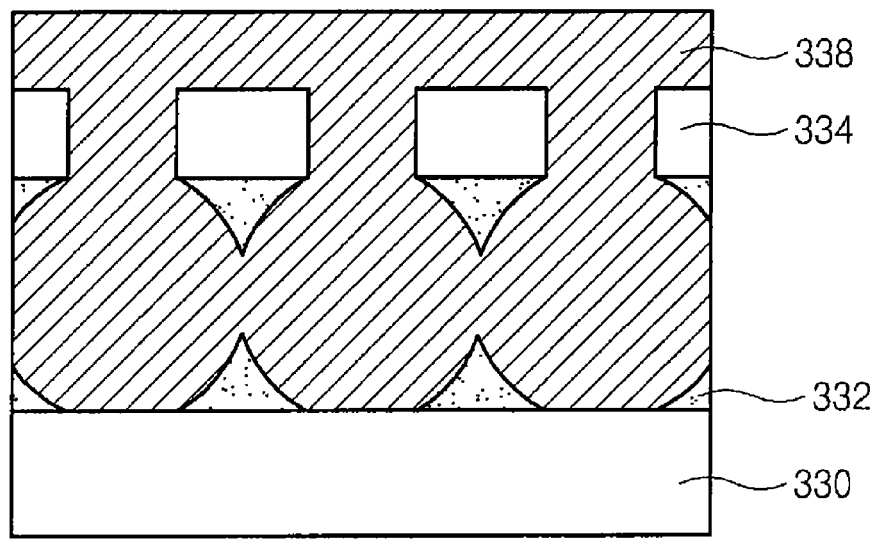
Figure 3D:
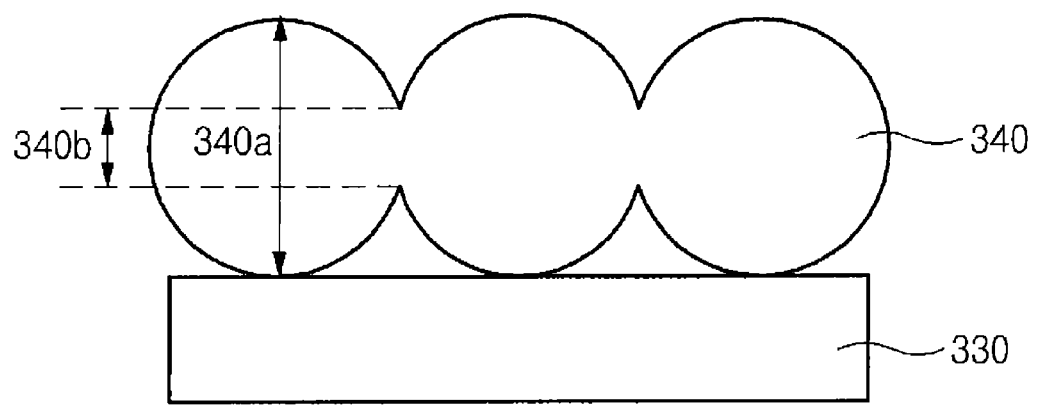

Referring to FIGS. 3c and 3d, a polysilicon layer 338 is formed to fill recess 336 having an uneven outline. Polysilicon layer 338 is planarized until first insulating film 332 is exposed. First insulating film 332 is removed to form a fuse pattern 340. Fuse pattern 340 includes a first thickness 340a and a second thickness 340b smaller than first thickness 340a. Second thickness 340b ranges from 5% to 20% of first thickness 340a. Although the present invention shows that a rugged profile in fuse pattern 340 is formed according to a vertical direction of semiconductor substrate 330, it is not limited herein. As a result, a rugged profile in fuse pattern 340 can be formed in a horizontal direction of semiconductor substrate 330.

Figure 4:
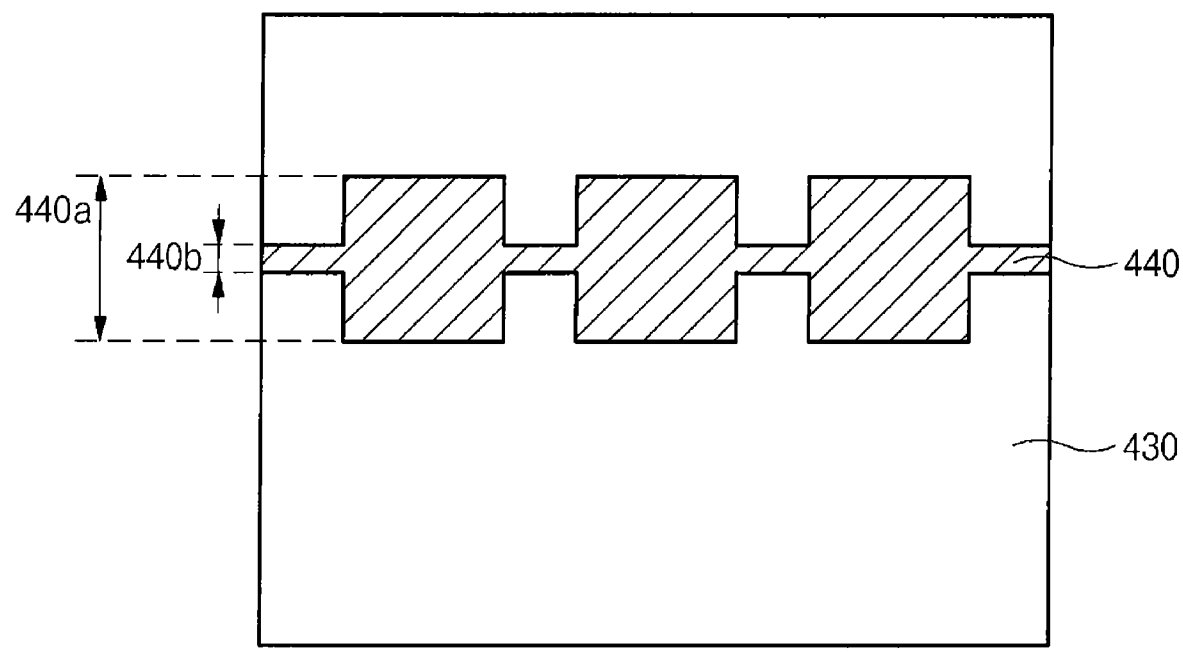
FIG. 4 is a top-view of a fuse pattern according to an embodiment of the present invention.

FIG. 4 is a top-view of a fuse pattern according to an embodiment of the present invention. An uneven outline in a fuse pattern 440 can be formed according to a horizontal direction of a semiconductor substrate 430. Fuse pattern 440 can be formed by performing a patterning process using a mask that defines a rugged profile. Fuse pattern 440 includes a first line-width 440a and a second line-width 440b smaller than first line-width 440a. Second line-width 440b ranges from 5% to 20% of first line-width 440a.

Figure 5:
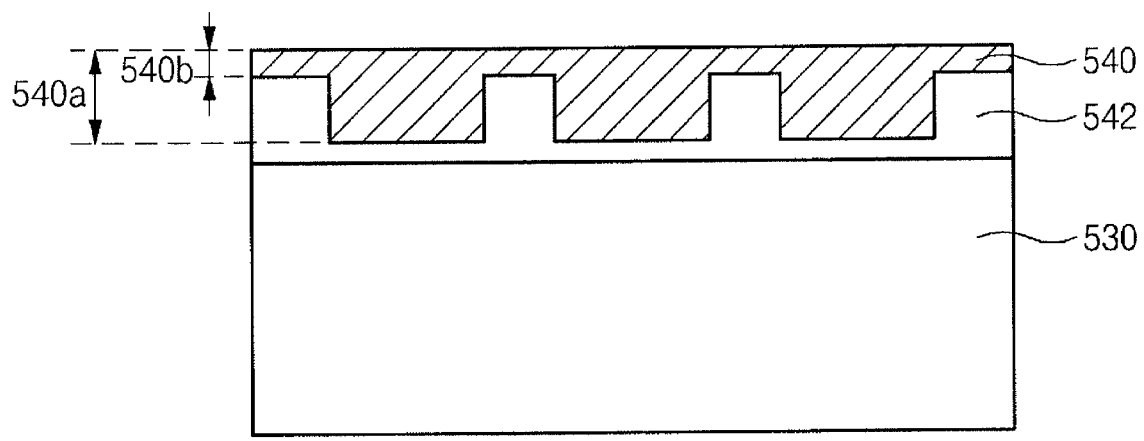
FIG. 5 is a top-view of a fuse pattern according to an embodiment of the present invention.

FIG. 5 is a side-view of a fuse pattern according to an embodiment of the present invention. An uneven outline in a fuse pattern 540 can be formed according to a vertical direction of a semiconductor substrate 530. Fuse pattern 540 can be formed by a damascene process. For example, an interlayer insulating film (not shown) is formed over semiconductor substrate 530. The interlayer insulating film is selectively etched to form an interlayer insulating pattern 542. A polysilicon layer (not shown) is formed to fill interlayer insulating pattern 542. The polysilicon layer is planarized to form fuse pattern 540 having a vertical uneven profile.

Fuse pattern 540 includes a first thickness 540a and a second thickness 540b smaller than first thickness 540a. Second thickness 540b ranges from 5% to 20% of first thickness 540a. Interlayer insulating pattern 542 has a three-dimensional uneven outline, thereby obtaining an uneven fuse pattern in the both the vertical and horizontal directions.

Figure 6:
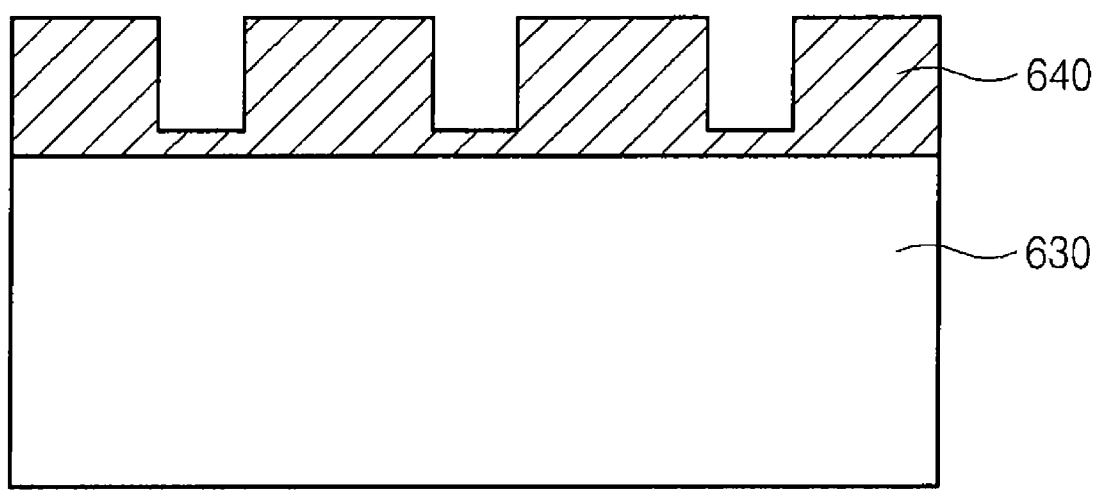
FIG. 6 is a cross-sectional view of a fuse pattern according to an embodiment of the present invention.

FIG. 6 is a cross-sectional view of a fuse pattern according to an embodiment of the present invention. A polysilicon layer (not shown) is formed over a semiconductor substrate 630. A portion of the polysilicon layer is selectively etched to form a fuse pattern 640 having an uneven profile.

FIGS. 7a to 7d are cross-sectional views illustrating a method of forming a fuse box according to an embodiment of the present invention. A first interlayer insulating film 762 is formed over a semiconductor substrate 730. A plate electrode (not shown) is formed over first interlayer insulating film 762. A fuse pattern 740 having an uneven profile is formed over first interlayer insulating film 762 when the plate electrode is formed. Fuse pattern 740 having a rugged profile can be formed by the methods of FIGS. 3 to 6. Fuse pattern 740 may minimize a fuse fail where a fuse is not completely cut when blowing a fuse.

Figure 7A:
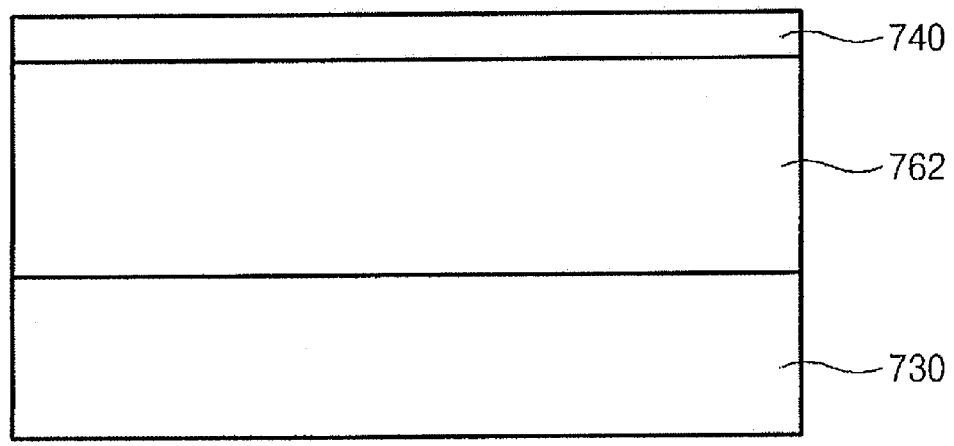
FIGS. 7a to 7d are cross-sectional views illustrating a method of forming a fuse box according to an embodiment of the present invention.
Figure 7B:
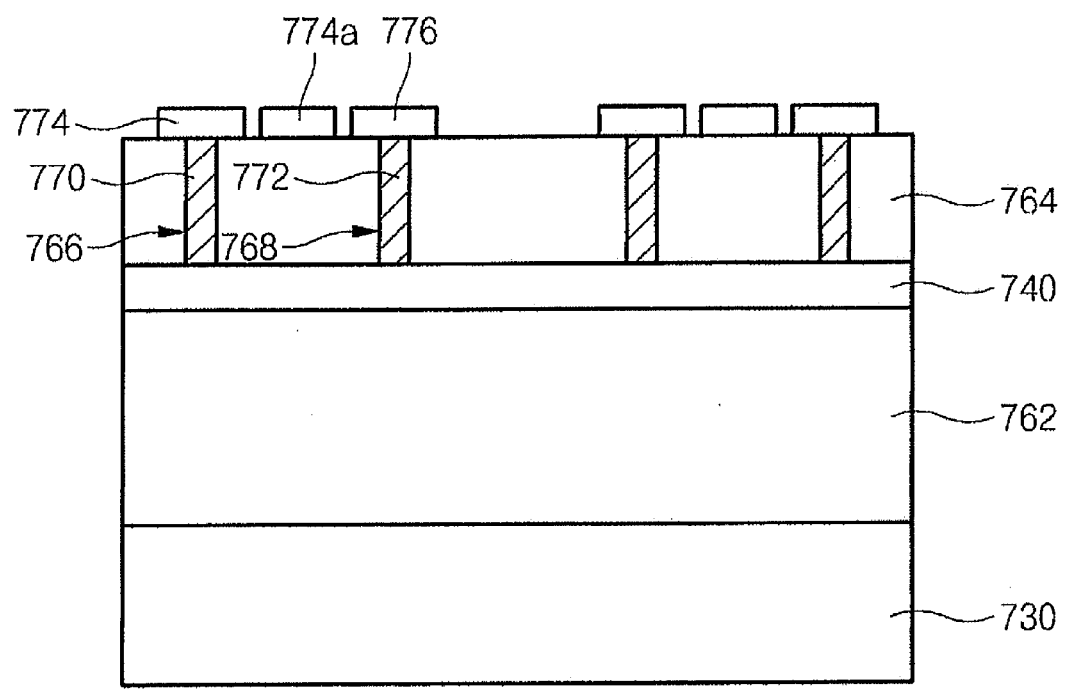

Referring to FIG. 7b, a second interlayer insulating film 764 is formed over first interlayer insulating film 762 to fill fuse pattern 740. Second interlayer insulating film 764 is selectively etched to form a first metal contact hole 766 and a dummy metal contact hole 768. First metal contact hole 766 and dummy metal contact hole 768 are filled with a conductive layer (not shown) to form a first metal contact plug 770 and a dummy metal plug 772 electrically connected to fuse pattern 740.

A conductive layer (not shown) is formed over first metal contact plug 770, dummy metal plug 72 and second interlayer insulating film 764. The conductive layer is patterned to form a first metal line 774 and a dummy metal line 776. Dummy metal line 776 and dummy metal contact plug 772 serve as a guard ring to prevent oxidation of the plate electrode and crack of the fuse pattern. While first metal contact plug 770 and first metal line 774 are formed, dummy metal plug 772 and dummy metal line 776, which serve as a guard ring, are formed, thereby simplifying the process.

Figure 7C:
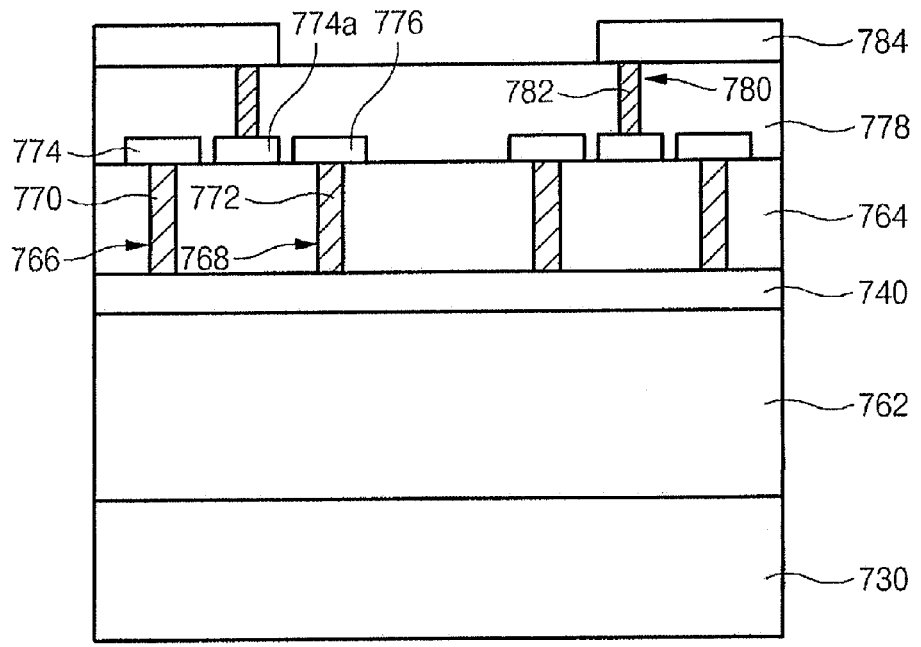

Referring to FIG. 7c, a third interlayer insulating film 778 is formed over second interlayer insulating film 764 to fill first metal lines 774, 774a and dummy metal line 776. Third interlayer insulating film 778 is selectively etched to form a second metal contact hole 780 that exposes first metal line 774a. Second metal contact hole 780 is filled with a conductive layer (not shown) to form a second metal plug 782 connected electrically to first metal line 774a. A conductive layer (not shown) is formed over third interlayer insulating film 778. The conductive layer is patterned to form a second metal line 784.

Figure 7D:
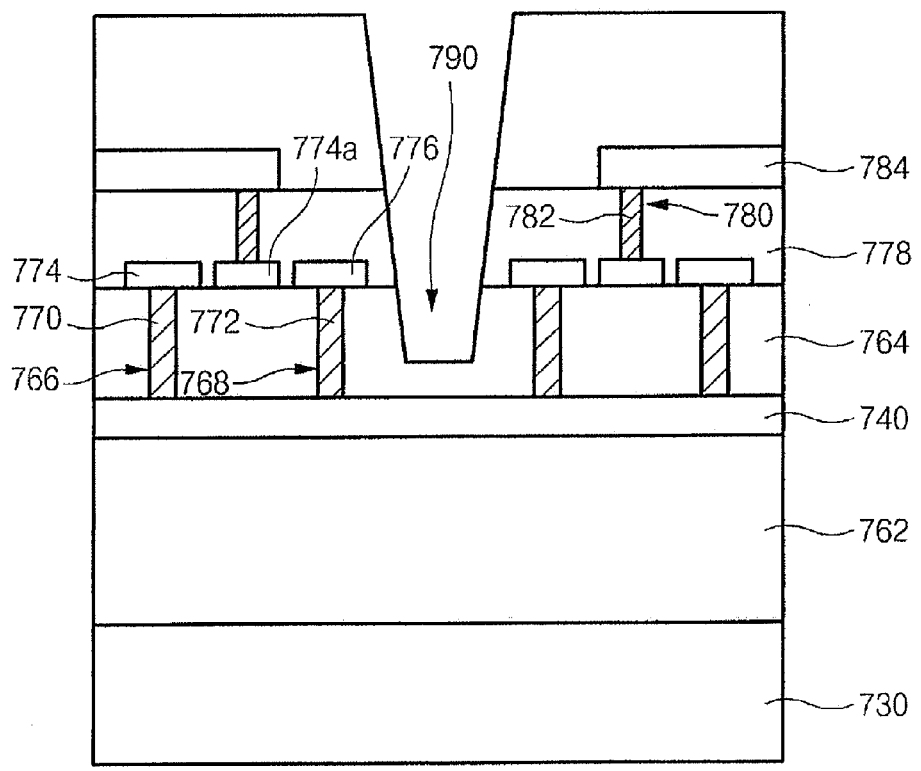

Referring to FIG. 7d, a fourth interlayer insulating film 786 is formed over third interlayer insulating film 778 to fill second metal line 784. A portion of fourth interlayer insulating film 786, third interlayer insulating film 778, and second interlayer insulating film 764 is selectively etched to form a blowing window 790 that defines a fuse blowing portion.

As described above, according to an embodiment of the present invention, a structure of a fuse pattern is changed to reduce a fuse blowing failure, thereby improving yield and reliability of devices.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A fuse box comprising:
   a fuse pattern having an uneven profile, wherein the fuse pattern has at least two different thicknesses;
   an interlayer insulating film covering the fuse pattern and including a fuse blowing window; and
   a guard ring formed in the interlayer insulating film, wherein the guard ring comprises a dummy contact plug electrically connected to the fuse pattern and a dummy interconnect line directly electrically connected only to the dummy contact plug.

2. The fuse box of claim 1, wherein the fuse pattern includes a plate electrode.

3. The fuse box of claim 1, wherein the uneven profile includes a plurality of bodies and a pluralities of connectors, the bodies having a first width and the connectors having a second width less than the first width.

4. The fuse box of claim 3, wherein the second width is no more than about 15% of the first width.

5. The fuse box of claim 1, wherein the uneven profile includes a first thickness and a second thickness less than the first thickness.

6. The fuse box of claim 5, wherein the second thickness is no more than about 15% of the first thickness.

7. A method for forming a fuse box, the method comprising: forming a plate electrode over a semiconductor substrate to form a fuse pattern having an uneven profile, wherein the fuse pattern has at least two different thicknesses; forming an interlayer insulating film to cover the fuse pattern; forming a guard ring in the interlayer insulating film, wherein the guard ring comprises a dummy contact plug electrically connected to the fuse pattern and a dummy interconnect line directly electrically connected only to the dummy contact plug; and etching a portion of the interlayer insulating film to form a fuse blowing window.

8. The method of claim 7, wherein the process of forming the fuse pattern is performed using a damascene method.

9. The method of claim 8, wherein the process of forming the fuse pattern comprises:
   forming a mask layer over the semiconductor substrate;
   etching the mask layer to form a mask pattern including a recess having the uneven profile;
   forming a plate polysilicon layer over the mask pattern to fill the recess; and
   polishing the plate polysilicon layer until the mask pattern is exposed, to form the plate electrode and the fuse pattern.

10. The method of claim 7, wherein the process of forming the fuse pattern comprises:
   forming a plate polysilicon layer over the semiconductor substrate; and
   etching the plate polysilicon layer using a rugged mask to form the plate electrode and the fuse pattern.

11. A method for forming a fuse box, the method comprising: forming a plate electrode over a semiconductor substrate to form a fuse pattern having an uneven profile, wherein the fuse pattern has at least two different thicknesses; forming a first interlayer insulating film to cover the fuse pattern; forming a first metal contact plug and a dummy contact plug for a guard ring in the first interlayer insulating film, the first metal contact plug and the dummy contact plug being electrically connected with the plate electrode; forming a first metal interconnect line and a dummy interconnect line over the first interlayer insulating film, the first metal interconnect line electrically connected with the first metal contact plug and the dummy interconnect line directly electrically connected only to the dummy contact plug; forming a second interlayer insulating film over the first interlayer insulating film including the first metal interconnect line and the dummy interconnect line; and selectively etching the second interlayer insulating film and a portion of the first interlayer insulating film to form a fuse blowing window.

* * * * *